United States Patent [19]
Furukawa

[11] Patent Number: 5,906,700
[45] Date of Patent: May 25, 1999

[54] METHOD OF MANUFACTURING CIRCUIT MODULE

[75] Inventor: Ryota Furukawa, Fukuoka, Japan

[73] Assignee: Matsushita Electric Industrial Co., Ltd., Osaka, Japan

[21] Appl. No.: 08/790,453

[22] Filed: Jan. 29, 1997

[30] Foreign Application Priority Data

Jan. 30, 1996 [JP] Japan ................................. 8-013678

[51] Int. Cl.⁶ ............................................. H01L 23/31
[52] U.S. Cl. ................................. 156/244.12; 264/272.14
[58] Field of Search ............................ 29/840; 156/242, 156/244.11, 244.12; 264/272.14

[56] References Cited

U.S. PATENT DOCUMENTS 5,232,651  8/1993  Okuno et al. .................. 264/272.14 X

FOREIGN PATENT DOCUMENTS 1 074 923  4/1980  Canada .
2-260592  10/1990  Japan .
3-92046  9/1991  Japan .

*Primary Examiner*—Francis J. Lorin
*Attorney, Agent, or Firm*—Stevens, Davis, Miller & Mosher, L.L.P.

[57] ABSTRACT

A bare chip is mounted on a land of a substrate, and electrodes on an upper surface of the bare chip are connected with pads by means of wires. The pads are formed in lines so as to face the land, and electrodes for the soldering of electrodes of rectangular electronic parts are formed in the empty spaces between the vertical and horizontal lines of pads. After soldering the rectangular electronic parts, the bare chip is mounted and then sealed with resin. The rectangular electronic parts soldered between the lines of pads are entirely or partly sealed with the resin as well as the bare chip. The rectangular electronic parts are mounted in the spaces between the lines of pads, and therefore the bare chip and the rectangular electronic parts can be mounted at a higher density so that the substrate can be made smaller and more compact.

2 Claims, 5 Drawing Sheets

METHOD OF MANUFACTURING CIRCUIT MODULE

BACKGROUND OF THE INVENTION

1. Field of the Invention

This invention relates to a method of manufacturing a circuit module in which a bare chip or chips of IC, memory and the like and solder-connected electronic parts are mounted on a single electronic circuit board (hereinafter referred to as a substrate).

2. Description of the Prior Art

Recently, there have been increasing demands for ever smaller electronic equipments. Circuit modules which are to be built in electronic equipment are becoming smaller. Most ICs and memories are mounted on the circuit module in the form of a flat package called QFP or SOP. The flat package is formed by mounting a bare chip or chips on a lead frame, electrically connecting the lead frame with the bare chip and then molding the same with resin. However, from the viewpoint of aiming at smaller size of the circuit module, it is necessary to mount the bare chip directly on the substrate. Conventional examples of this kind of technology are disclosed in Japanese Patent Unexamined Publication No. 2-260592 and Japanese Utility Model Unexamined Publication No. 3-92046. FIG. 12 is a plan view of a conventional substrate, and FIG. 13 is a fragmentary enlarged sectional view showing a state in which cream solder is being applied onto the same substrate. FIGS. 12 and 13 simply illustrate the content of the above publications. In FIG. 12, reference numeral 1 denotes a substrate, and a large number of pads 3 are formed around a land 2 in the center of substrate 1. The pads 3 are formed in lines of four pads 3 so as to face to four sides of the land 2. A bare chip 4 is mounted on the land 2. Electrodes 5 on an upper surface of the bare chip 4 are connected with the pads 3 by means of wires 6. The bare chip 4 and the wires 6 are sealed with resin 7.

A large number of rectangular electronic parts 8 are mounted by the side of the bare chip 4. The rectangular electronic part 8 means that in which electrodes are formed on opposite sides of a box-shaped main body, examples of which are resistance chip, chip capacitor and so on. Electrodes 9 of each of the rectangular electronic parts 8 are fixed onto electrodes 10 of the substrate 1 with solder 11.

FIG. 13 shows a state in which, after mounting the bare chip 4 due to sealing with the resin 7, cream solder 11 is being applied onto the electrodes 10 by means of screen printing for the purpose of the soldering of the rectangular electronic parts 8. Reference numeral 12 denotes a screen mask in which pattern holes 13 are formed in the positions corresponding to the electrodes 10 of the printed substrate 1. The screen mask 12 is formed with a projecting portion 12a for avoiding the resin 7. As shown in the drawing, by sliding a squeegee 15 over the screen mask 12 put on top of the substrate 1, the cream solder 11 is applied onto the electrodes 10. In the succeeding step, reflowing is performed to cause the cream solder 11 to melt and solidify to form the solder 11 shown in FIG. 12.

However, in the conventional method described above, after the mounting of the bare chip 4, the cream solder 11 was applied by screen printing and then the rectangular electronic parts 8 were mounted, and therefore there was a problem that the rectangular electronic parts 8 had to be mounted in positions distant from the resin 7. Particularly as shown in FIG. 13, the screen mask 12 should be formed with the projecting portion 12a having a gently-inclined tapered surface a so as to allow the squeegee 15 to slide smoothly. For this reason, printing of the cream solder 11 was unstable in the vicinity of the tapered surface a, and therefore the pattern holes 13 were formed in the area at a horizontal distance L from the tapered surface a (or the area outside of the broken line in FIG. 12). In order to assure the distance L, the mounting positions of the rectangular electronic parts 8 had to be kept away from the bare chip 4 to a great extent, giving rise to a problem that the mounting of the bare chip could not contribute to smaller size of the circuit module so much.

SUMMARY OF THE INVENTION

It is therefore an object of the present invention to provide a method of manufacturing a circuit module which is capable of mounting a bare chip or chips and solder-connected electronic parts at higher density.

To this end, the present invention provides a method of manufacturing a circuit module formed by mounting a bare chip and an electronic part on a substrate which has a land for the mounting of the bare chip, a plurality of pads to be electrically connected with the bare chip mounted on the land, and a plurality of electrodes formed in the vicinity of the plural pads for allowing to effect soldering of the electronic part, which method comprises the steps of: supplying a solder for allowing to effect soldering of the electronic part to the electrodes; mounting the electronic part on the solder; subjecting the substrate to reflowing to melt and solidify the solder to solder the electronic part to the electrodes; supplying a bond to the land; mounting the bare chip on the bond; subjecting the substrate to heat treatment to harden the bond; cleaning surfaces of the pads contaminated by the soldering; electrically connecting electrodes of the bare chip with the pads by means of wires; and sealing the bare chip and the wires with resin in such a manner as to cover at least a part of the electronic part.

Futher, the present invention provides a method of manufacturing a circuit module formed by mounting a bumped work and an electronic part on a substrate which has a plurality of pads to be electrically connected with bumps of the bumped work, and a plurality of electrodes formed in the vicinity of the plural pads for allowing to effect soldering of the electronic part, which method comprises the steps of: supplying a solder for effecting soldering of the electronic part to the electrodes; mounting the electronic part on the solder; subjecting the substrate to reflowing to melt and solidify the solder to solder the electronic part to the electrodes; electrically connecting the bumps of the bumped work with the land; and sealing the bumped work and at least a part of the electronic part with resin.

In accordance with one aspect of the invention, after the soldering of the electronic parts, the bare chip is mounted on the substrate and electrically connected with the pads of the substrate by means of the wires, and therefore in the step of supplying the solder used for the soldering onto the electrodes by means of screen printing, it is possible to use an ordinary flat screen mask instead of the conventional screen mask having the projecting portion.

Further, the electrodes used for the soldering of the electronic parts can be arranged closer to the pads than conventional, which allows the electronic parts to be mounted at higher density so as to make the circuit module smaller. Moreover, although the surfaces of the pads are contaminated at the time of soldering, the surfaces of the pads are cleaned before connection with the wires, and therefore the wire bonding to be performed after the soldering can be carried out with reliability.

In addition, the bare chip and the wires may be sealed with the resin in such a manner as to cause at least a part of the electronic parts in the vicinity of the bare chip to be covered, in which case the bare chip and the wires can be reliably sealed with the use of a sufficient amount of resin.

In accordance with another aspect of the invention, after the soldering of the electronic parts, bumps of the bumped work are electrically connected with the pads of the substrate, and therefore in the step of supplying the solder used for the soldering onto the electrodes by means of screen printing, it is possible to use an ordinary flat screen mask instead of the conventional screen mask having the projecting portion.

Further, the electrodes used for the soldering of the electronic parts can be arranged closer to the pads than conventional, which allows the electronic parts to be mounted at higher density so as to make the circuit module smaller.

In addition, the bumped work may be sealed with the resin in such a manner as to cause at least a part of the electronic parts in the vicinity of the bumped work to be covered, in which case the bare chip and the wires can be reliably sealed with the use of a sufficient amount of resin.

DESCRIPTION OF THE PREFERRED EMBODIMENTS

Now, description will be given of preferred embodiments of the present invention with reference to the drawings.

Embodiment 1

Figure 1:
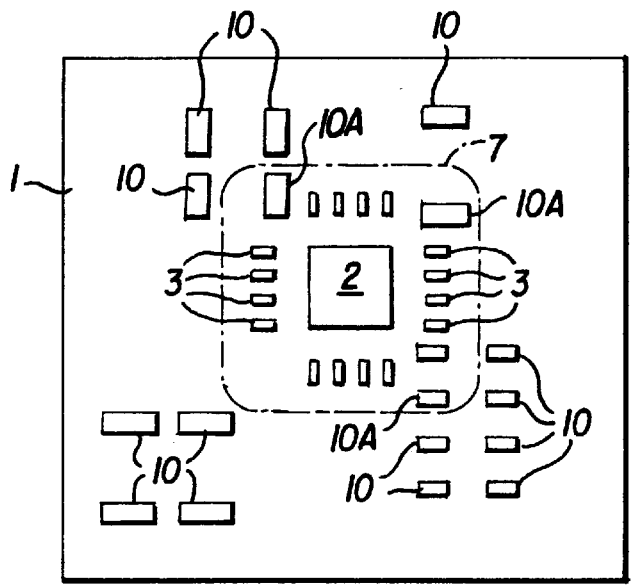
FIG. 1 is a plan view of a substrate according to a first embodiment of the present invention.
Figure 2:
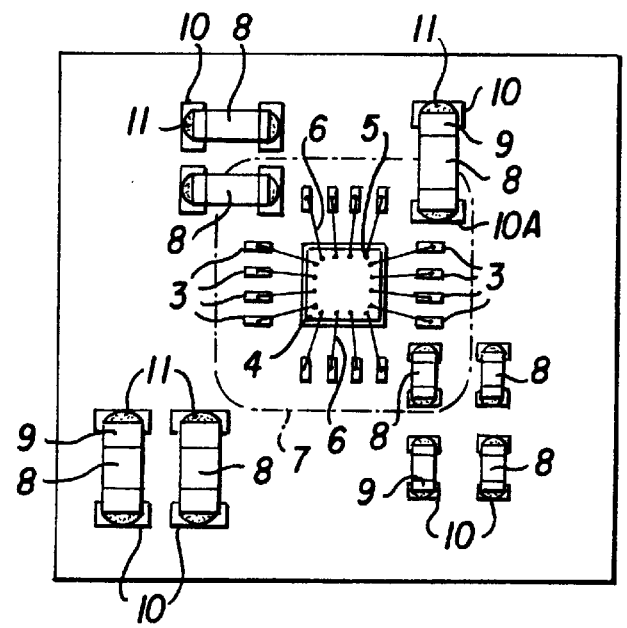
FIG. 2 is a plan view of a circuit module according to the first embodiment of the invention.

FIG. 1 is a plan view of a substrate according to a first embodiment of the present invention, FIG. 2 is a plan view of a circuit module according to the first embodiment, and FIGS. 3 to 10 are illustrations for explaining a method of manufacturing the circuit module according to this embodiment. In the drawings, the same components as those of the aforementioned conventional example are denoted by the same reference numerals, respectively.

Referring to FIG. 1, a land 2 is formed in the center of a substrate 1. Pads 3 are formed in lines of four pads 3 so as to face to four sides of the land 2. Reference numeral 10 denotes electrodes used for the mounting of rectangular electronic parts. Out of a large number of electrodes 10, the electrodes designated by reference numeral 10A are formed in the empty spaces near and between the vertical and horizontal lines of pads 3 so that the rectangular electronic parts 8 are mounted close to a bare chip 4.

FIG. 2 shows a finished good of the substrate 1 on which the bare chip 4 and the rectangular electronic parts 8 are mounted, that is, a circuit module. The bare chip 4 is mounted on the land 2, and electrodes 5 on an upper surface of the bare chip 4 are connected with the pads 3 by means of wires 6. Meanwhile, electrodes 9 of the rectangular electronic parts 8 are fixed onto the electrodes 10 with solder 11. Resin 7 for sealing the bare chip 4 also seals entirely or partly the rectangular electronic parts 8 on the empty spaces described above.

Figure 12:
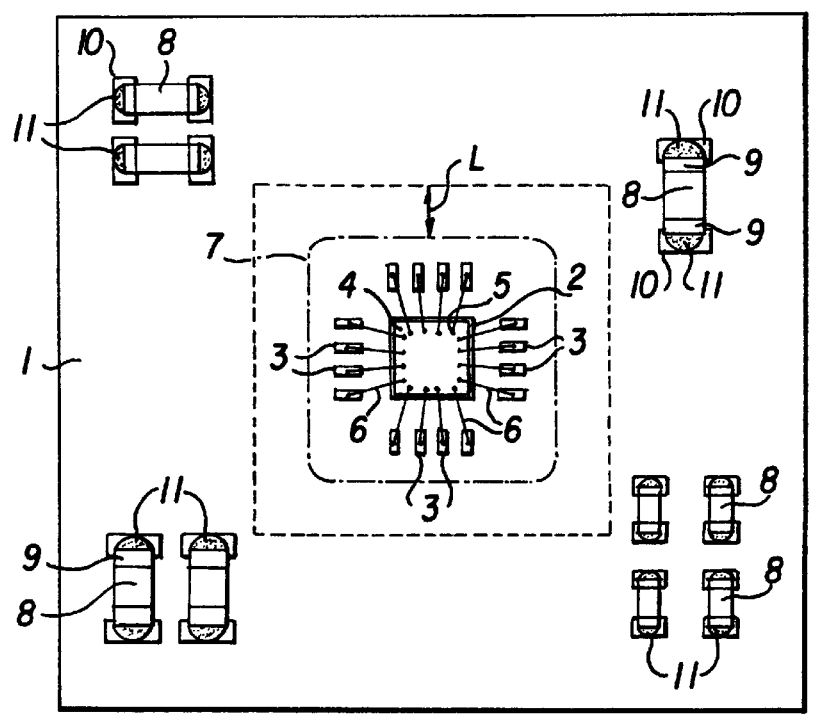
FIG. 12 is a plan view of a conventional substrate.
Figure 13:
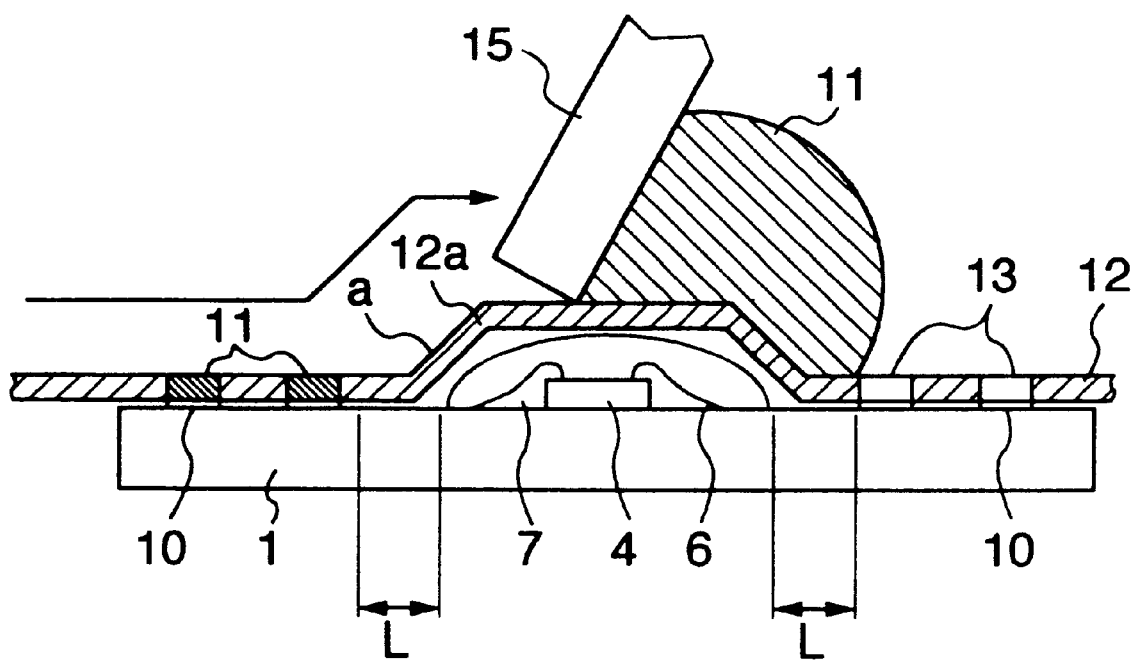
FIG. 13 is a fragmentary enlarged sectional view showing a state in which cream solder is being applied onto the conventional substrate.

In this substrate 1, the electrodes 10A are formed in the empty spaces and the rectangular electronic parts 8 are mounted on the electrodes 10A, and therefore the bare chip 4 and the rectangular electronic parts 8 can be mounted in noticeably closer relation to each other than in the conventional example shown in FIG. 12. This contributes to materialization of high-density surface mounting, which makes the substrate 1 smaller and more compact to a great extent.

Figure 3:
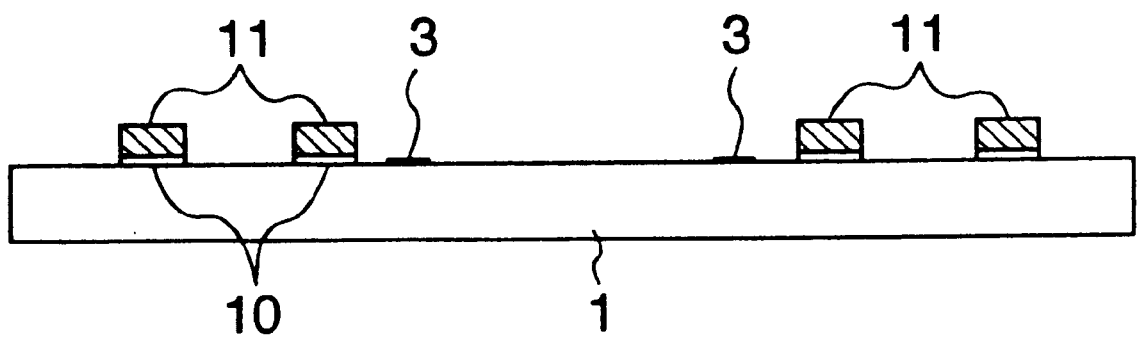
FIG. 3 is an explanatory view of a method of manufacturing the circuit module according to the first embodiment of the invention.
Figure 4:
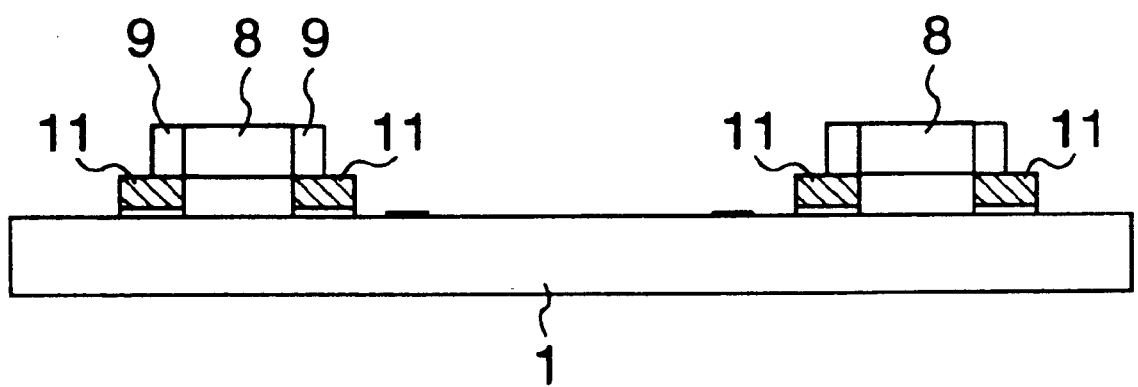
FIG. 4 is an explanatory view of the method of manufacturing the circuit module according to the first embodiment of the invention.
Figure 5:
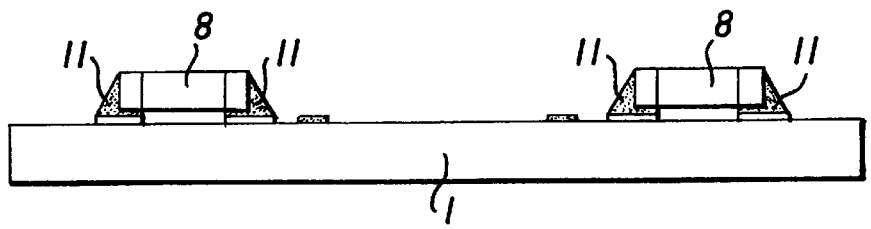
FIG. 5 is an explanatory view of the method of manufacturing the circuit module according to the first embodiment of the invention.

Referring now to FIGS. 3 to 10, the process of manufacture of the circuit module shown in FIG. 2 will be described. In the first place, cream solder 11 is applied onto the electrodes 10 on the substrate 1 as shown in FIG. 3. Application of the cream solder 11 is performed by means of screen printing. In the aforesaid conventional example, the cream solder 11 was applied by screen printing after sealing the bare chip 4 with the resin 7, and therefore the screen mask 12 had to be formed with the projecting portion 12a having the tapered surface a. In this embodiment, however, since the cream solder 11 is applied before sealing the bare chip 4 with resin, the screen mask need not be formed with the projecting portion 12a, and therefore the rectangular electronic parts 8 can be mounted close to the bare chip 4. Then, as shown in FIG. 4, the rectangular electronic parts 8 are placed and mounted on the cream solder 11. After this, as shown in FIG. 5, the substrate 1 is sent into a heating furnace in which reflowing is performed to cause the cream solder 11 to melt and solidify, thereby soldering the electrodes 9 to the electrodes 10. In this step, however, surfaces of the pads 3 are contaminated very much by flux and so on contained in the cream solder 11.

Figure 6:
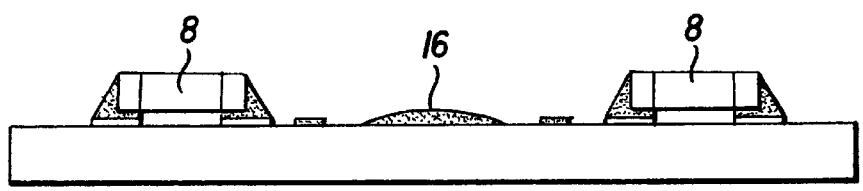
FIG. 6 is an explanatory view of the method of manufacturing the circuit module according to the first embodiment of the invention.
Figure 7:
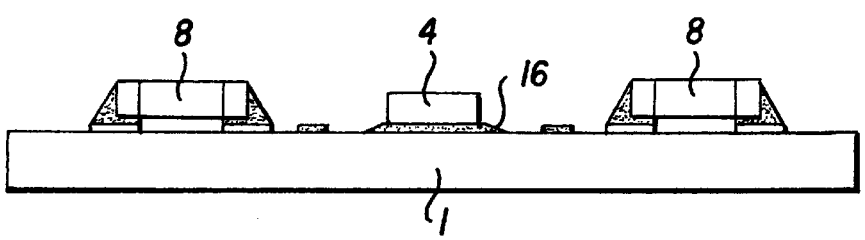
FIG. 7 is an explanatory view of the method of manufacturing the circuit module according to the first embodiment of the invention.

Subsequently, as shown in FIG. 6, bond 16 is applied onto the land 2 by means of a dispenser (not shown), and the bare chip 4 is mounted on the bond 16 (see FIG. 7). The bond 16 is heated together with the substrate 1 by a curing device so as to be hardened, thereby fixing the chip 4 onto the substrate.

Figure 8:
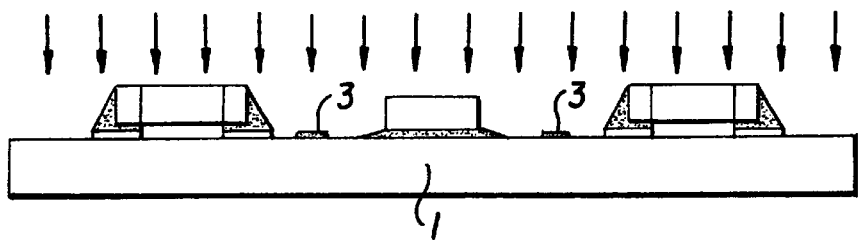
FIG. 8 is an explanatory view of the method of manufacturing the circuit module according to the first embodiment of the invention.

There follows the cleaning of the upper surfaces of the pads 3 carried out by means of plasma cleaning or the like (see FIG. 8). Due to this cleaning, the surfaces of the pads 3 contaminated by soldering are cleaned so as to enhance the bonding efficiency of the wires in the succeeding step. In FIG. 8, arrow marks show plasma ions for physically cleaning the pads 3. The step of cleaning may be carried out before applying the bond 16 onto the land 2, in which case, however, organic gas generated from the bond 16 during hardening might cause the pads 3 to undergo secondary contamination to affect the bonding efficiency of the wires.

Figure 9:
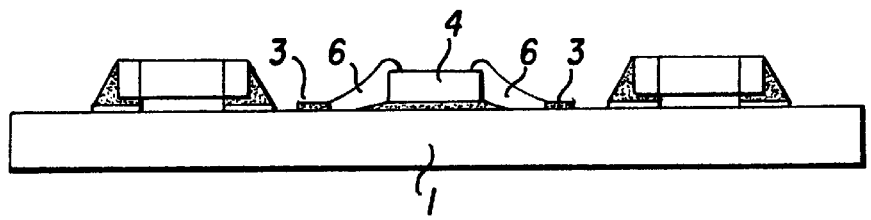
FIG. 9 is an explanatory view of the method of manufacturing the circuit module according to the first embodiment of the invention.
Figure 10:
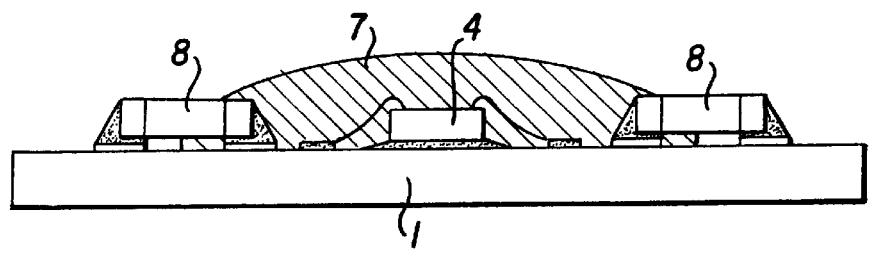
FIG. 10 is an explanatory view of the method of manufacturing the circuit module according to the first embodiment of the invention.

Then, as shown in FIG. 9, the electrodes 5 on the upper surface of the bare chip 4 are connected with the pads 3 by means of the wires 6. Finally, the bare chip 4 is sealed with the resin 7 (see FIG. 10). The resin 7 is so applied as to partly or entirely seal the rectangular electronic parts 8 in the vicinity of the bare chip 4, as well as the bare chip 4 and the wires 6. In this embodiment, since the bare chip 4 is close to the adjacent rectangular electronic parts 8, if it is intended to seal only the bare chip 4 and the wires 6 with the resin 7 as conventionally, it is necessary to lessen the amount of application of the resin 7, with the result that it is thought the amount of application is not sufficient to fail in sealing them depending on the circumstances. However, even if the rectangular electronic parts 8 are partly covered with the resin 7, the function as circuit module is never deteriorated. Accordingly, in this embodiment, the resin 7 is applied to the extent that the rectangular electronic parts in the vicinity of the bare chip 4 are partly covered, thereby making sure of the sealing.

In the first embodiment, the rectangular electronic part 8 has been described as being the solder-connected electronic part, but either a cylindrical electronic part or a part with leads may be used.

Embodiment 2

Figure 11:
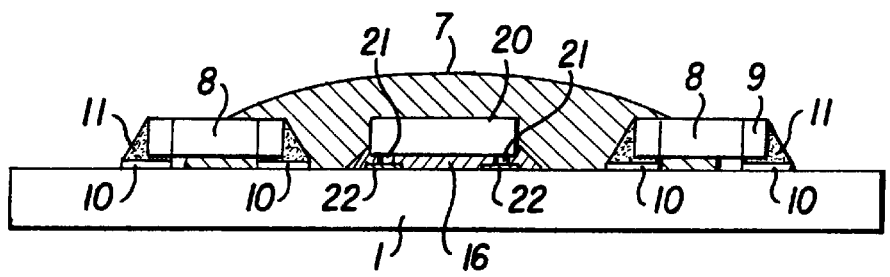
FIG. 11 is a sectional view of a circuit module according to a second embodiment of the invention.

FIG. 11 is a sectional view of a circuit module according to a second embodiment of the present invention. Reference numeral 20 denotes a flip-chip (or a bumped work), and bumps 21 are projectingly formed on a lower surface thereof. The substrate 1 is formed with pads 22 on which the bumps 21 are to be placed, respectively. In the vicinity of the pads 22 are formed the electrodes 10 to which the rectangular electronic parts 8 are to be soldered.

Now, a method of manufacturing the circuit module according to the second embodiment will be described. As shown in FIG. 11, the electrodes 9 of the rectangular electronic parts 8 are fixed onto the electrodes 10 of the substrate 1 with the solder 11. Then the bond 16 is applied onto the pads 22 and the bumps 21 are placed on the pads 22 so as to cause the bumped work 20 to adhere onto the substrate 1 by means of the bond 16. This brings about electrical connection between the bumps 21 and the pads 22. Subsequently, the resin 7 is applied for sealing the bumped work 20. The rectangular electronic parts 8 are mounted close to the bare chip 20, and therefore the resin 7 seals the rectangular electronic parts 8 entirely or partly. In the second embodiment, it is preferable to make the pads 22 undergo plasma cleaning to clean the surfaces of the pads 22 contaminated in the soldering step prior to the application of the bond 16.

What is claimed is:

1. A method of manufacturing a circuit module formed by mounting a bare chip and a first electronic part on a substrate which has a land for the mounting of the bare chip, a plurality of pads to be electrically connected with the bare chip mounted on said land, and a plurality of electrodes formed in the vicinity of said plural pads for allowing to effect soldering of the first electronic part, said method comprising:

(a) mounting said first electronic part on said substrate by:
   supplying a solder for effecting soldering of the first electronic part to said electrodes on said substrate and for enabling electric connection of said first electronic part with said electrodes;
   (ii) mounting the first electronic part on said solder; and
   (iii) subjecting said substrate to reflowing to melt and solidify the solder to solder said first electronic part to said electrodes; and thereafter (b) mounting said bare chip on said substrate by:
   (i) supplying a bond to said land;
   (ii) mounting the bare chip on said bond, said bare chip being a second electronic part which is a different type of electronic part than said first electronic part;
   (iii) subjecting the substrate to heat treatment to harden said bond;
   (iv) cleaning surfaces of said pads contaminated by said soldering;
   (v) thereafter, electrically connecting electrodes of said bare chip with said pads by means of wires; and
   (vi) sealing said bare chip and said wires with resin in such a manner as to cover at least a part of said first electronic part.

2. A method of manufacturing a circuit module formed by mounting a bumped work and a first electronic part on a substrate which has a plurality of pads to be electrically connected with bumps on the bumped work, and a plurality of electrodes formed in the vicinity of said plural pads for allowing to effect soldering of the first electronic part, said method comprising:

(a) mounting said first electronic part on said substrate by:
   (i) supplying a solder for effecting soldering of the first electronic part to said electrodes on said substrate and for enabling electric connection of said first electronic part with said electrodes;
   (ii) mounting the first electronic part on said solder;
   (iii) subjecting said substrate to reflowing to melt and solidify the solder to solder said first electronic part to said electrodes; and thereafter (b) mounting said bumped work on said substrate by:
   (i) electrically connecting the bumps of the bumped work with said land, said bumped work being a second electronic part which is a different type of electronic part than said first electronic part; and
   (ii) sealing said bumped work and at least a part of said first electronic part with resin.

\* \* \* \* \*